United States Patent [19]

Lee

[11] Patent Number: 5,758,321
[45] Date of Patent: May 26, 1998

[54] DATA RECORDING APPARATUS AND METHOD FOR A SEMICONDUCTOR MEMORY CARD

[75] Inventor: Young-Man Lee, Suwon, Rep. of Korea

[73] Assignee: Samsung Electronics Co., Ltd., Kyungki-do, Rep. of Korea

[21] Appl. No.: 608,739

[22] Filed: Feb. 29, 1996

[30] Foreign Application Priority Data

Jul. 13, 1995 [KR] Rep. of Korea ............... 20595/1995

[51] Int. Cl.⁶ ............................................. G10L 3/00
[52] U.S. Cl. ........................... 704/270; 704/275; 704/278
[58] Field of Search ......................... 395/2.79, 2.84, 395/2.87

[56] References Cited

U.S. PATENT DOCUMENTS

| | | | |
|---|---|---|---|
| 4,625,083 | 11/1986 | Poikela | 395/2.42 |
| 4,791,741 | 12/1988 | Kondo | 395/2.79 |
| 4,890,259 | 12/1989 | Simko | 365/45 |
| 4,989,179 | 1/1991 | Simko | 365/45 |
| 5,056,145 | 10/1991 | Yamamoto et al. | 395/2.79 |
| 5,473,729 | 12/1995 | Bryant et al. | 395/2.79 |
| 5,602,963 | 2/1997 | Bissonette et al. | 395/2.84 |

Primary Examiner—David R. Hudspeth
Assistant Examiner—Robert Louis Sax
Attorney, Agent, or Firm—Sughrue, Mion, Zinn, Macpeak & Seas, PLLC

[57] ABSTRACT

In a data recording apparatus and method of dividing a chapter automatically and recording the same in recording data onto a semiconductor memory card. The apparatus includes means for detecting sound and sound-free sections of audio data currently being recorded; means for ending the current recording operation if a sound-free section is detected for a time set by the sound and sound-free section detecting means; means for storing a chapter number which is updated, a start address, and time data in the TOC area of the IC memory card if a sound section of audio data is detected when the recording operation ends in the recording ending means; and means for storing the chapter number, start address, and time data and recording audio data in a new chapter. Therefore, since the chapter division is automatically performed, repeated key manipulations are not necessary.

3 Claims, 3 Drawing Sheets

DATA RECORDING APPARATUS AND METHOD FOR A SEMICONDUCTOR MEMORY CARD

BACKGROUND OF THE INVENTION

The present invention relates to a semiconductor memory card, and more particularly, to a data recording apparatus and method of dividing a chapter automatically and recording the same in recording data onto a semiconductor memory card.

In general, as semiconductor memory devices become highly integrated, several technologies have been proposed for storing voice data, song data and image data using a light thin small memory card as a recording medium for various kinds of information.

An apparatus for recording song data using such a memory card is disclosed in U.S. Pat. No. 4,813,014. Also, a portable recording and reproducing apparatus for recording music data onto a recording medium using a memory card is disclosed in the patent application 94-12148, proposed by the inventor of the instant invention. In the data recording method of such technologies, in order to separate chapters of different songs, a song is first recorded, and recording of another song ends so that a chapter is increased one by one. More particularly, whenever a song is recorded, an end key is pressed and a recording key is then pressed in order to separate the songs. Thus, the end key and recording key are iteratively operated for each song recording, which is a cumbersome work. Also, when several songs are consecutively recorded, if the end key is not pressed, the songs are not discernible from each other.

SUMMARY OF THE INVENTION

To solve the problems described above, it is, therefore, an object of the present invention to provide a data recording apparatus and method for recording data in a semiconductor memory card by automatically dividing chapters for each data type.

It is another object of the present invention to provide a data recording apparatus and a method for recording music data in a semiconductor memory card by automatically dividing chapters for each song.

To accomplish the above objects, there is provided a data recording apparatus for a semiconductor memory card comprising: analog/digital converting means for converting an analog audio signal input from a microphone or external device via an external input port into a digital audio signal and outputting the digital audio signal; digital signal processing means for detecting sound and sound-free sections from the digital audio signal, compressing, and outputting the digital audio signal; key input means having a recording key, an end key, and a chapter selection key for generating commands according to these key inputs; controlling means for generating time data corresponding to the range from a sound-free section to another sound-free section according to the sound/sound-free detection signal of audio data produced by the digital signal processing means, for controlling the time data and sound data to be recorded in a data transmission block if a recording command key is input from the key input means, and for automatically generating a recording start signal according to types of data by the sound/sound-free detection signal if a chapter selection key is input from the key input means, a data buffer for temporarily storing the data compressed by the digital signal processing means and the table of content (TOC) area information output to the controlling means, and an IC memory card for reading and storing the audio data and TOC area data stored in the data buffer.

Also, there is provided a data recording apparatus for a semiconductor memory card comprising: means for detecting sound and sound-free sections of audio data currently being recorded; means for ending the current recording operation if a sound-free section is detected for a time set by the sound and sound-free section detecting means; means for storing a chapter number which is updated, a start address, and time data in the TOC area of the IC memory card if a sound section of audio data is detected when a recording operation ends by the recording ending means; and means for storing the chapter number, start address, time data, and recording audio data in a new chapter.

Also, there is provided a data recording method for a semiconductor memory card comprising the steps of: detecting sound and sound-free sections of audio data currently being recorded; ending the current recording operation if a sound-free section is detected for the time set by the sound and sound-free section detecting step; storing a chapter number which is updated, a start address, and time data in the TOC area of the IC memory card if a sound section of audio data is detected when the recording operation ends in the recording ending step; storing the chapter number, start address, and time data; and generating a recording start signal and recording audio data in a new chapter.

BRIEF DESCRIPTION OF THE DRAWINGS

The above objects and advantages of the present invention will become more apparent with a detailed description of a preferred embodiment of the invention with reference to the attached drawings in which.

DETAILED DESCRIPTION OF THE INVENTION

Figure 1:
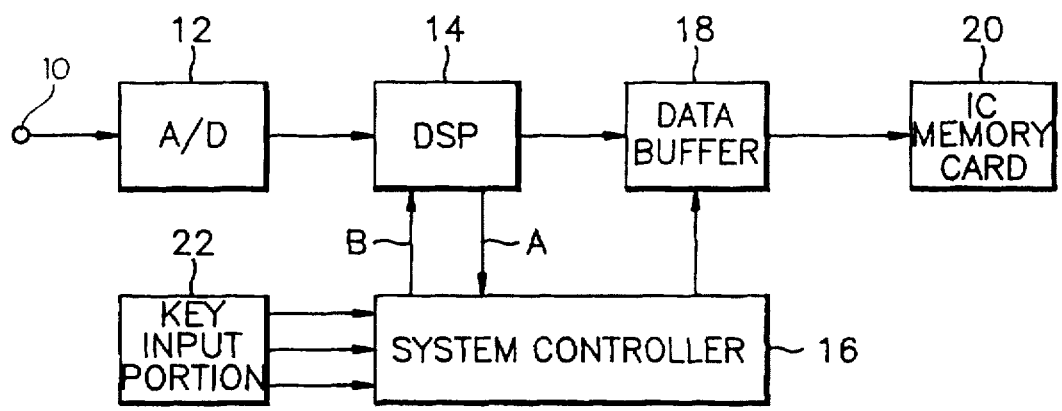
FIG. 1 is a block diagram of a data recording apparatus for a semiconductor memory card according to the present invention.

As shown in FIG. 1, an analog/digital (A/D) converter 12 converts analog audio data input from a microphone or external device via an external input port 10 into a digital audio signal which is output by the converter to a digital signal processor (DSP) 14. DSP 14 detects sound and sound-free sections of the digital audio signal, compresses, and outputs the digital audio signal, and extends and outputs the compressed data. A key input portion 22, having numerical keys and various function keys such as a recording key, an end key and a chapter selection key, generates various commands according to these key inputs which are supplied to a system controller 16. System controller 16 generates time data corresponding to the range from a sound-free section to another sound-free section according to a sound/sound-free detection signal of audio data produced by DSP 14, controls the time data and sound data to be recorded in a data transmission block if a recording command key is input from key input portion 22, and automatically generates a recording start signal according to types of data by the sound/sound-free detection signal if a chapter selection key is input from key input portion 22. A data buffer 18 temporarily stores the data compressed by DSP 14 and the table of content (TOC) area information output to said controlling means. An IC memory card 20 reads and stores the audio data and TOC area data stored in data buffer 18.

Figure 2:
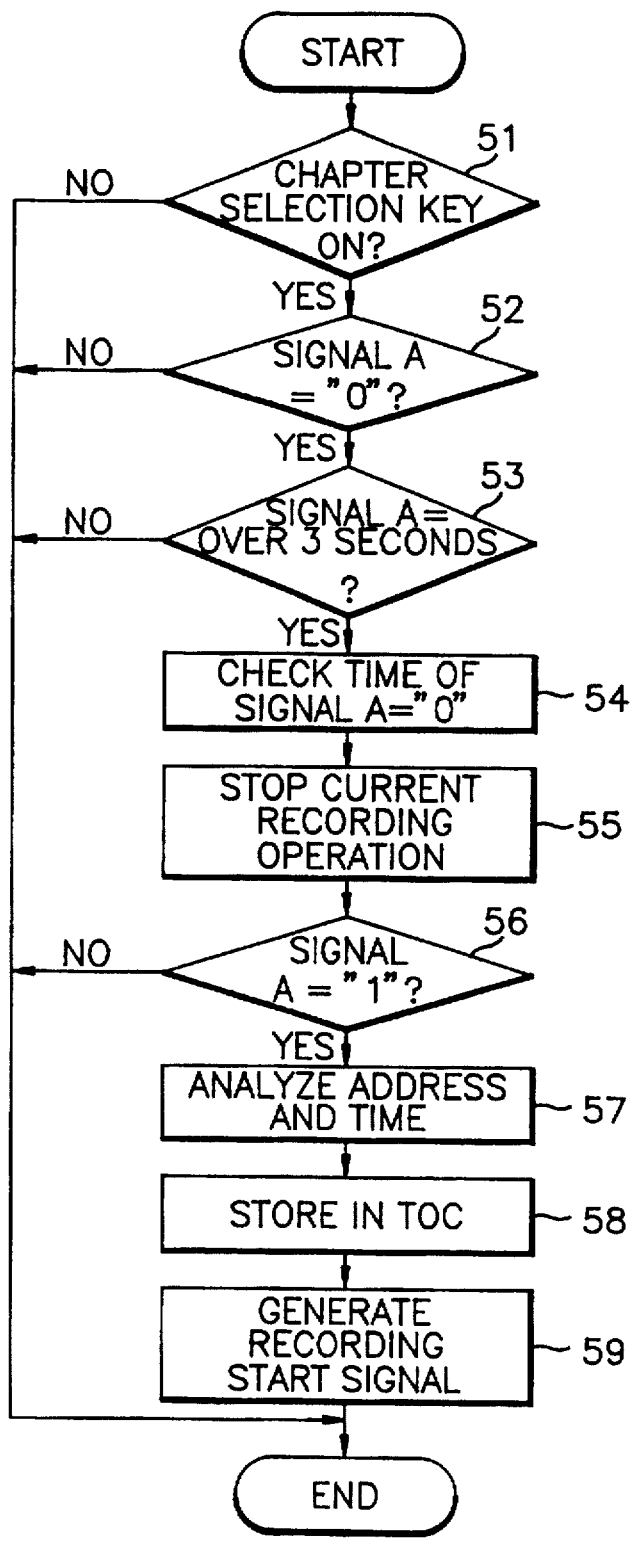
FIG. 2 is a control flowchart for recording data by automatically dividing chapters according to the present invention.

FIG. 2 is a control flowchart for recording data by automatically dividing chapters according to the present invention, which includes the steps of detecting sound and sound-free sections of audio data currently being recorded if the chapter selection key is turned on, ending the current recording operation if a sound-free section is detected for a time set in the sound and sound-free section detecting step, updating a chapter number a start address, and time data in the TOC area if a sound section of audio data is detected when the recording operation ends in the recording ending step, and recording audio data in a new chapter.

Figure 3:
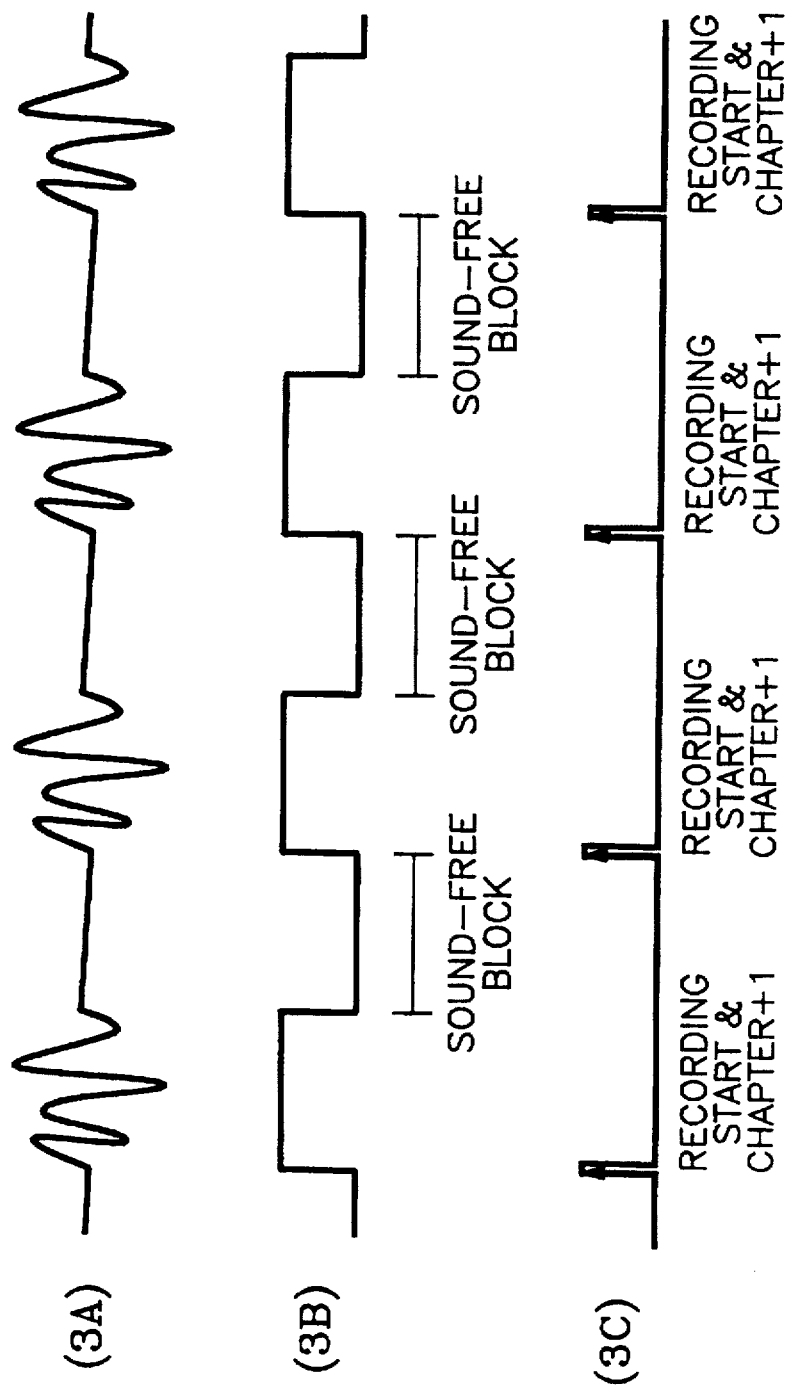
FIG. 3 is a waveform diagram of sound and sound-free signals of audio signals between songs according to the present invention.

FIG. 3 is a virtual waveform diagram of sound and sound-free signals of audio signals between songs according to the present invention.

Figure 4:
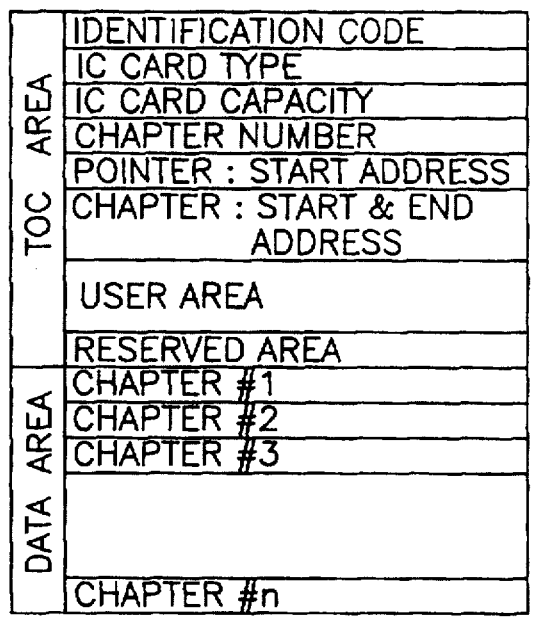
FIG. 4 is a data recording format of an IC memory card according to the present invention.

FIG. 4 is a data recording format of an IC memory card according to the present invention, which includes a TOC area in which TOC information is stored and a data area in which a plurality of programs corresponding to the TOC area is stored. The TOC area includes an identification code, an IC card type, an IC card capacity, chapter numbers, a pointer, chapters, a user area, and a reserved area. The identification code is a 10-byte ASCII code for checking whether or not an inserted memory card is formatted properly. If an unformatted card is inserted, the system formats the card. The IC memory card type information indicates the memory type is one of a mask ROM, a dynamic random access memory (DRAM), a static random access memory (SRAM), and a flash memory. The 3-byte card capacity information indicates a memory capacity. In other words, the memory capacity tells how many hours a recording medium lasts. The chapter number of 1-byte indicates the number of currently recorded programs. A maximum 128 programs are possibly recorded. Here, a chapter is indicated by the range from the recording start initiated by pressing the recording key to a recording end. Thus, a 1-byte chapter number means that 128 recording operations are allowed. Since as many pointers as chapters are generated, the maximum pointer is 128 bytes and has initial address information for the area where start and end address information for each chapter are stored. The chapter start and end address area has the corresponding information and occupies 128×6-byte capacity. Next, the user area has 128×15-byte capacity, and the information on year, month, date, time, and simple title information is stored therein during the recording of each chapter. The reserved area corresponds to the remaining TOC area, excluding the areas set forth above, and has a capacity of approximately 4 kbytes. The area following 4 kbyte area is the data area.

Figure 5:
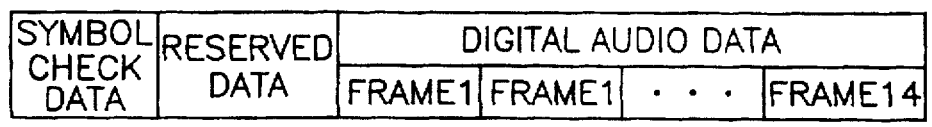
FIG. 5 shows a data format for forming a block in a chapter and for recording the same according to the present invention.

FIG. 5 shows a data format for forming a block in the unit of chapters and for recording the same according to the present invention.

The data contained in each chapter includes 1-byte sound-free time data (symbol check data), 3-byte reserved data, and digital audio data of 14 frames in a basic block.

A preferred embodiment of the present invention will be described in detail with reference to accompanying drawings.

When IC memory card 20 is loaded, the data of the TOC area is read and the identification code is checked to format a memory card if the memory card is being used for the first time. In such a state, if the recording key is pressed from key input portion 22, system controller 16 recognizes a recording command to record the current recording data, time, and minute in IC memory card 20. The last currently set pointer value is incremented by 1 to generate a new pointer. A value obtained by adding 1 to the end address value of the last recorded chapter is stored as a start address of the presently recorded program.

Thereafter, the analog audio signal input from a microphone or external device via external input port 10 is converted into the digital audio signal in an A/D converter 12 and is then supplied to DSP 14. At this time, DSP 14 compresses 160 samples of the input audio data in the unit of frames, detects a sound/sound-free signal A (FIG. 1) as shown in FIG. 3B with respect to the input audio signal as shown in FIG. 3A which is supplied to system controller 16.

System controller 16 receives the sound/sound-free signal A (FIG. 1) as shown in FIG. 3B to form a transmission block of 14 frames led by the sound-free time data and stores the data in the memory address of IC memory card 20 set from the start address in the unit of the transmission block. Here, the sound-free time data (symbol check data) means a section without an audio signal, which is checked block by block to represent the time corresponding to the number of blocks in codes. For example, assuming that sound-free sections last for four consecutive blocks and 20 milliseconds are assigned to each block, the sound-free section will last for 80 milliseconds. Therefore, a hexadecimal number "00" corresponds to a sound section. However, if there is a different value, a sound-free section exists accordingly. In other words, if the hexadecimal number is "00," the decoding operation is immediately performed without time delay. However, in other cases, decoding operation is terminated to the extent of the sound-free data. Then, after the sound-free interval ends, the decoding operation is again performed.

Each frame comprises 17-bytes of compressed data. The 17-byte compressed data is processed in a unit of 160 samples to be compressed by a code excited linear prediction compression algorithm.

As described above, the audio data is recorded in IC memory card 20. After a reproduction key is input, in step 51, system controller 16 checks whether the chapter selection key input from key input portion 22 is on or not. If the chapter selection key is not on, the recording key is pressed as is conventionally the case to start recording, the end key is pressed and then the recording key is again pressed. These steps are iteratively performed, thereby recording audio data so as to divide chapters. However, if the chapter selection key is on, the process proceeds to step 52 to check whether or not the signal A, shown in FIG. 3B and which is output from DSP 14, is a sound-free signal. If the signal is not a sound-free signal, the recording operation continues to be performed. If the output is a sound-free signal the process is proceeded to step 53. If the signal A of FIG. 3B is 1, it becomes a sound signal. If the signal A is 0, it becomes a sound-free signal. In step 53, system controller 16 checks whether the sound/sound-free signal is detected as the sound-free signal for over three seconds from the signal A of FIG. 3B. In other words, the time gap which is regarded to be enough to divide chapters is detected. At this time, if the sound-free signal is detected for over three seconds, the process proceeds to step 54. Then, system controller 16 clears the check time of the signal A of FIG. 3B to 0 for executing the chapter division. This is for checking the time of detection of the sound-free signal to be re-performed later. In step 55, system controller 16 ends the recording operation currently in progress to proceed to step 56. In step 56, system controller 16 checks whether the signal as shown in FIG. 3B is detected again as the sound signal. If the sound signal is detected, the process is proceeded to step 57. In step 57, system controller 16 analyzes the address of IC memory card 20, the current time when the sound signal is again detected, and the chapter number is incremented. Thereafter, in step 58, the analyzed result is stored in the TOC area of IC memory card 20, shown in FIG. 4 and the process proceeds to step 59. In step 59, in order to start recording again, system controller 16 generates a recording start signal B shown in FIG. 3C to supply to DSP 14. Therefore, the aforementioned operations are iteratively performed to start the next recording.

In the embodiment of the present invention, the chapter selection key is turned on by inputting the chapter selection key in the key input portion 22. However, without departing from the scope of the present invention, the chapter division for an input audio signal can be implemented automatically such that the chapter selection state may be unconditionally turned on during recording time without the chapter selection key.

As described above, since the recording is performed to implement a chapter division automatically in recording data in a semiconductor IC memory card, the repetitions manipulation of an end key and a recording key is not necessary whenever songs are recorded.

What is claimed is:

1. A data recording apparatus for a semiconductor memory card comprising:

analog/digital converting means for converting an analog audio signal input from a microphone or an external device into a digital audio signal and for outputting said digital audio signal;

digital signal processing means for detecting at least one of: sound and sound-free sections of said digital audio signal, for producing a sound/sound-free detection signal, and for compressing and outputting said digital audio signal to produce audio data;

key input means having a recording key, an end key, and a chapter selection key for generating recording, end, and selection commands, respectively;

controlling means for generating time data corresponding to a range from a first sound-free section to a second sound-free section according to said sound/sound-free detection signal, for controlling said time data and audio data to record said time and audio in a data transmission block if said key input means generates said recording command, and for automatically generating a recording start signal according to said sound/sound-free detection signal if said key input means generates said selection command;

a data buffer for temporarily storing said audio data and a table of content (TOC) area data output to said controlling means; and an IC memory card for reading and storing the audio data and TOC area data stored in said data buffer.

2. A data recording apparatus for a semiconductor memory card comprising:

detecting means for detecting at least one of: sound and sound-free sections of audio data undergoing a recording operation;

means for ending said recording operation if said detecting means detects a sound-free section for a predetermined time;

means for storing an updatable chapter number, a start address, and time data in a TOC area of an IC memory card if said detecting means detects a sound section of audio data after said recording operation ends; and means for updating said chapter number and is for restarting said recording operation and to record audio data in a new chapter.

3. A data recording method for a semiconductor memory card comprising the steps of:

detecting at least one of sound and sound-free sections of audio data undergoing a recording operation;

ending said recording operation if a sound-free section is detected for a predetermined time;

storing an updatable chapter number, a start address and time data in a TOC area of an IC memory card if a sound section of audio data is detected after said recording operation ends; and updating said chapter number; and generating a recording restart signal to record audio data in a new chapter.

* * * * *